US006968305B1

(12) United States Patent
Isles

(10) Patent No.: US 6,968,305 B1
(45) Date of Patent: Nov. 22, 2005

(54) CIRCUIT-LEVEL MEMORY AND COMBINATIONAL BLOCK MODELING

(75) Inventor: Adrian J. Isles, Oakland, CA (US)

(73) Assignee: Averant, Inc., Alameda, CA (US)

(*) Notice: Subject to any disclaimer, the term of this patent is extended or adjusted under 35 U.S.C. 154(b) by 518 days.

(21) Appl. No.: 09/586,191

(22) Filed: Jun. 2, 2000

(51) Int. Cl.[7] .......................... G06F 17/50; G06G 7/62
(52) U.S. Cl. .............................. 703/15; 703/2; 703/13; 703/14; 703/20; 703/21; 703/22; 716/16; 341/106
(58) Field of Search ........................ 345/816; 341/106; 708/235; 714/759; 703/20–22, 2, 13–15; 716/18, 16

(56) References Cited

U.S. PATENT DOCUMENTS

| | | | | |
|---|---|---|---|---|
| 4,855,946 A | * | 8/1989 | Ruben et al. | 708/276 |
| 5,537,341 A | * | 7/1996 | Rose et al. | 716/16 |
| 5,555,199 A | * | 9/1996 | Cunningham et al. | 703/1 |
| 6,148,436 A | * | 11/2000 | Wohl | 716/18 |
| 6,223,144 B1 | * | 4/2001 | Barnett et al. | 703/22 |
| 6,247,165 B1 | * | 6/2001 | Wohl et al. | 716/5 |
| 6,336,208 B1 | * | 1/2002 | Mohan et al. | 716/16 |
| 6,380,945 B1 | * | 4/2002 | MacInnis et al. | 345/602 |
| 6,492,833 B1 | * | 12/2002 | Asson et al. | 326/41 |
| 6,522,989 B1 | * | 2/2003 | Gover et al. | 702/126 |
| 6,539,477 B1 | * | 3/2003 | Seawright | 713/100 |
| 6,581,191 B1 | * | 6/2003 | Schubert et al. | 716/4 |
| 6,823,505 B1 | * | 11/2004 | Dowling | 717/140 |
| 6,895,421 B1 | * | 5/2005 | Dor et al. | 708/400 |

OTHER PUBLICATIONS

Weems, Charles C. Jr. "CmpSci 535 Notes from Lecture 9: Memory Hierarchy and Caching". © 1996. printed on Jun. 27, 2003 from http://www.cs.umass.edu/~weems/CmpSci535/535lecture9.html.*

Bayoumi, M. et al. "A Look-Up Table VLSI Design Methodology for RNS Structures Used in DSP Applications." IEEE Transactions on Circuits and Systems. vol. 34, Issue 6, Jun. 1997. pp. 604-616.*

Chang, Y. et al. "Cache Memory Protocols" Wiley Encyclopedia of Electrical and Electronics Engineering Online. Article Online Posting Date: Dec. 27, 1999.*

Patten, W.N. et al. "A Minimum Time Seek Controller for a Disk Drive." IEEE Transactions on Magnetics. vol. 31, Issue 3, May 1995. pp. 2380-2387.*

Grochowski, E. et al. "Issues in the Implementation of the i486 Cache and Bus." 1989 IEEE Int'l Conf. on Computer Design. (ICCD '89). Oct. 4, 1989. pp. 193-198.*

Cong, J. et al. "FlowMap: An Optimal Technology Mapping Algorithm for Delay Optimization in Lookup-Table Based FPGA Designs." IEEE Transactions on Computer-Aided Design of Integrated Circuits and Systems. vol. 13, Issue 1, Jan. 1994. pp. 1-12.*

Parhami, B. et al. "Optimal Table Lookup Schemes for VSLI Implementation of Input/Output Conversations and Other Residue Number Operations." [Workshop on] VLSI Signal Processing, VII, 1994. Oct. 28, 1994. pp. 470-481.*

(Continued)

*Primary Examiner*—Kevin J. Teska
*Assistant Examiner*—Ayal Sharon
(74) *Attorney, Agent, or Firm*—Vierra Magen Marcus Harmon & DeNiro LLP

(57) ABSTRACT

A method and apparatus for creating a memory model for use in modeling a physical memory of an electronic circuit design. Memory write operations to the physical memory and memory read operations are modeled in a lookup table. The number of entries in the lookup table is limited by an upper bound representing a total number of memory operations that can occur over a given number of clock cycles.

51 Claims, 8 Drawing Sheets

OTHER PUBLICATIONS

Zukowski, C. et al. "Putting Routing Tables in Silicon", IEEE Network. vol. 6, Issue 1, Jan. 1992. pp. 42-50.*

Schneider, C. "A Parallel / Serial Trade-Off Methodology for Look-up Table Based Decoders" Proc. of the 34th Annual Conf. on Design Automation Conf. 1997. pp. 498-503.*

Murgai, R. "Logic Synthesis for Programmable Gate Arrays" 27th Annual ACM/IEEE Design Automation Conference. 1991. pp. 620-625.*

Fpgacpu.org Glossary, © 2000-2002. http://www.fpgacpu.org/glossary.html. Printed on Dec. 2, 2004.*

Fujita, et al., " Speeding Up Look-Up-Table Driven Logic Simulation", VLSI 1999, pp 1-13.

Fujita, et al., " Logic Synthesis for a Single Large Look-up Table", ICCD 1995, hand annotated pp 1-10.

Shostak, Robert, E. "A Practical Decision Procedure for Arithmetic with Functional Systems", Journal of the Association for Computing Machinery, Apr. 1979, pp 351-360, vol. 26 , No. 2.

Srivas, et al., " Formal Verification of a Pipelined Microprocessor", IEEE Software, Sep. 1990, pp 52-64, vol. 7, No. 5.

Burch, et al., "Automatic Verification of Pipelined Microprocessor Control", Proceedings of the 6th International Conference on Computer Aided Verification, Jun. 1994, pp 68-80.

Hojati, et al., "Automatic Datapath Abstraction in Hardware Systems", Proceedings of the 7th International Conference on Computer Aided Verification, Jul. 1995, pp 98-113.

Hojati, et al., "Verification Using Uninterpreted Functions and Finite Instantiations", Proceedings of the First International Conference on Formal Methods in Computer-Aided Design, Nov. 1996, pp 218-232.

Isles, et al., "Computing Reachable Control States of Systems Modeled with Uninterpreted Functions and Infinite Memory", Proceedings of the 10th International Conference on Computer-Aided Verification, Jul. 1998, pp 256-267.

Brayton, et al. "VIS: A System for Verification and Synthesis", The VIS Group, In the Proceedings of the 8th International Conference on Computer Aided Verification, Springer Lecture Notes in Computer Science, #1102, J.

* cited by examiner

CIRCUIT-LEVEL MEMORY AND COMBINATIONAL BLOCK MODELING

BACKGROUND OF THE INVENTION

1. Field of the Invention

The present invention relates to electronic design automation (EDA) systems. More particularly, the present invention relates to memory modeling for use with EDA tools.

2. Description of the Related Art

The design process for integrated circuits typically involves multiple transformations of a design from an initial idea to a functional, manufacturable product. A chip architect or designer begins with a design idea and then generates a corresponding behavioral definition of the design. The behavioral design results in a flow chart or a flow graph using which the designer can design the system data path and the registers and logic units necessary for implementation of the design. After the designer designs buses for coordinating and controlling the movement of data between registers and logic units, the data registers, buses, logic units, and their controlling hardware are implemented using logic gates and flip-flops. The result of this design stage is a netlist of gates and flip-flops. The netlist can be used to create a simulation model of the design to verify the design before provide the information needed by a routing software package to complete the actual design. The netlist of gates and flip-flops is thus transformed into a transistor list or layout and gates and flip-flops are replaced with their transistor equivalents or library cells. Timing and loading issues are also addressed during this cell and transistor selection process. Finally, the manufacturing process begins when the transistor list is implemented in a programmable logic device such as an FPGA or when the layout specification is used to generate masks for integrated circuit fabrication.

EDA tools improve upon this design process by permitting electronic circuit designers to more quickly and inexpensively design and verify their designs. FIG. 1 illustrates a typical design approach using EDA tools. The designer initially supplies a logic synthesis tool 120 with a high level language description 110 of the design and the logic synthesis tool 120 reduces the high level language description 110 to a low level or gate level description 130 of the design. Finally, verification or simulation of the design is performed by an engine 140 using a set of properties 150 or behaviors as an input to determine whether, and to what extent, the design described by HDL description 110 satisfies the properties 150. The properties 150 are based on a functional specification for the design being verified or simulated. A more detailed discussion of design verification and the use of properties can be found in U.S. patent application Ser. No. 09/447,085, filed Nov. 22, 1999, entitled "Static Coverage Analysis," incorporated herein by reference.

The description of the design idea is typically written in a high-level hardware description language ("HDLs") such as VHDL or Verilog. HDLs provide formats for representing the output of the various design stages described above and are thus used to create circuits at various levels of abstraction including gate-level descriptions of functional blocks and high-level descriptions of complete systems. HDLs provide a convenient format for the representation of functional and wiring details of designs and may represent various hardware components at one or more levels of abstraction. HDLs can be used to model many different kinds of hardware components or electronic circuits. VHDL and Verilog are commonly used to model circuits ranging from ALUs, arithmetic blocks, bus arbiters, bus interfaces, cache controllers, data paths, dual-phase clocks, instruction and address decoders, pipelines, reset circuits, sequencers, and state machines.

The design approach of FIG. 1 has also been previously used to model, synthesize, and verify memory circuit designs. However, prior art memory models suffered from two major disadvantages. First, they modeled every location of the memory even if only a subset of locations of the memory were actually used by the design. For example, if the designer is modeling a RAM having, for example, 1024 locations, the designer must provide a functional description for each location of the memory even if the design only accessed a small portion of the memory locations. The resulting memory model was inefficient and wasted valuable design resources. Second, memory models from one EDA tools vendor can typically only be used with simulation or verification engines from the same vendor. In other words, the choice to use a particular prior art memory model necessitated a particular verification or simulation engine. This lack of interoperability greatly limits the utility of prior art memory models.

Accordingly, there is a need for a means for modeling physical memory that more efficiently describes only those portions of a physical memory that are used by a given design. There is a further need for a memory model that is independent of the underlying simulation or verification engine and is thus interoperable with various simulation or verification engines.

SUMMARY OF THE INVENTION

The present invention, roughly described, provides a method for modeling a physical memory for use in an electronic circuit design where memory write operations to the physical memory and memory read operations from the physical memory are modeled in a lookup table. The size or the number of entries in the lookup table is limited by a total number of memory operations that can occur over a given number of clock cycles. In one embodiment, the upper bound is equal to the total number of memory operations that can be performed per clock cycle times the number of clock cycles plus any number of memory read operations specified in the properties. In another embodiment, the contents of the lookup table can, at any time, be initialized to a constant value or to an arbitrary initial value.

The present invention can be implemented using software, hardware, or a combination of software and hardware. When all or portions of the present invention are implemented in software, that software can reside on a processor readable storage medium. Examples of an appropriate processor readable storage medium include a floppy disk, hard disk, CD-ROM, memory IC, etc. The hardware used to implement the present invention includes an output device (e.g. a monitor or printer), an input device (e.g. a keyboard, pointing device, etc.), a processor in communication with the output device and processor readable storage medium in communication with the processor.

The processor readable storage medium stores code capable of programming the processor to perform the steps to implement the present invention. In one embodiment, the present invention may comprise a dedicated processor including processor instructions for performing the steps the implement the present invention. In another embodiment, the present invention can be implemented on a web page on the Internet or on a server that can be accessed over communication lines. These and other objects and advantages of the invention will appear more clearly from the following detailed description in which the preferred embodiment of the invention has been set forth in conjunction with the drawings.

DETAILED DESCRIPTION

Figure 2:
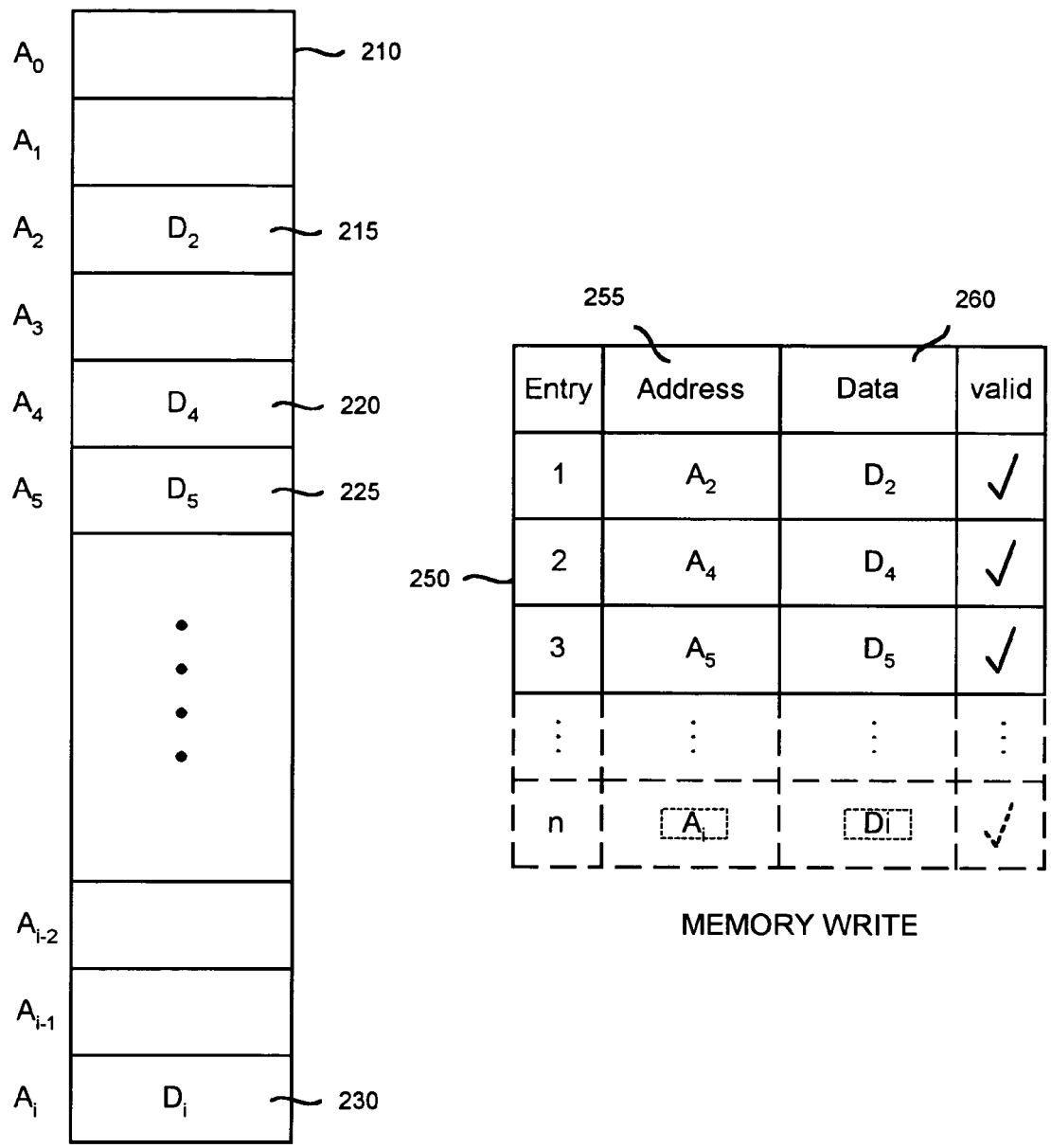
FIG. 2 illustrates a memory model that can be implemented as a lookup table for use in modeling a physical memory of an electronic circuit design.

FIG. 2 illustrates a memory model that can be implemented as lookup table 250, for use in modeling a physical memory 210 of an electronic circuit design. While physical memory 210 contains "i" locations, data has been written to only four of those locations. In physical memory 210, for example, the electronic circuit design has written a plurality of write data bits represented by $D_2$ to write address $A_2$. A plurality of write data bits represented by $D_4$ have been written to write address $A_4$. A plurality of write data bits represented by $D_5$ have been written to write address $A_5$. A plurality of write data bits represented by $D_i$ have been written to write address $A_i$. Rather than modeling all "i" locations of physical memory 210, the present invention models only those locations of physical memory 210 that have been accessed by the electronic circuit design. Lookup table 250 is created to perform this task. Lookup table 250 comprises an address field 255, a data field 260, and a valid bit field 265. While not drawn, lookup table 250 may also include a write enable bit that can be asserted to signify a memory write operation. It should also be noted that all valid bits of lookup table 250 in valid bit field 265 are initially in an unasserted logic state.

The total number of entries in lookup table 250 ("n") is defined by the total number of memory operations that can occur over a given number of clock cycles. More specifically, the total number of entries in lookup table 250 is greater than or equal to the total number of memory operations that can occur in physical memory 210 over a given number of clock cycles (or over the period of time in which physical memory 210 is modeled or over the period in which the electronic circuit comprising physical memory 210 is simulated or verified).

This upper bound is computed by determining the number of read and write ports of the physical memory that is to be modeled, determining a total number of memory operations that can be performed per clock cycle, and multiplying the total number of memory operations per clock cycle with the number of clock cycles. For example, if the physical memory that is to be modeled contains two read ports and two write ports, then a maximum of four memory operations can occur in each clock cycle (i.e., two times two). Thus, if the period of time over which the physical memory is to be modeled is, for example, five cycles, then the total number of memory operations that can occur over this period of time is twenty (i.e., four memory operations per clock cycle times five cycles).

Figure 1:
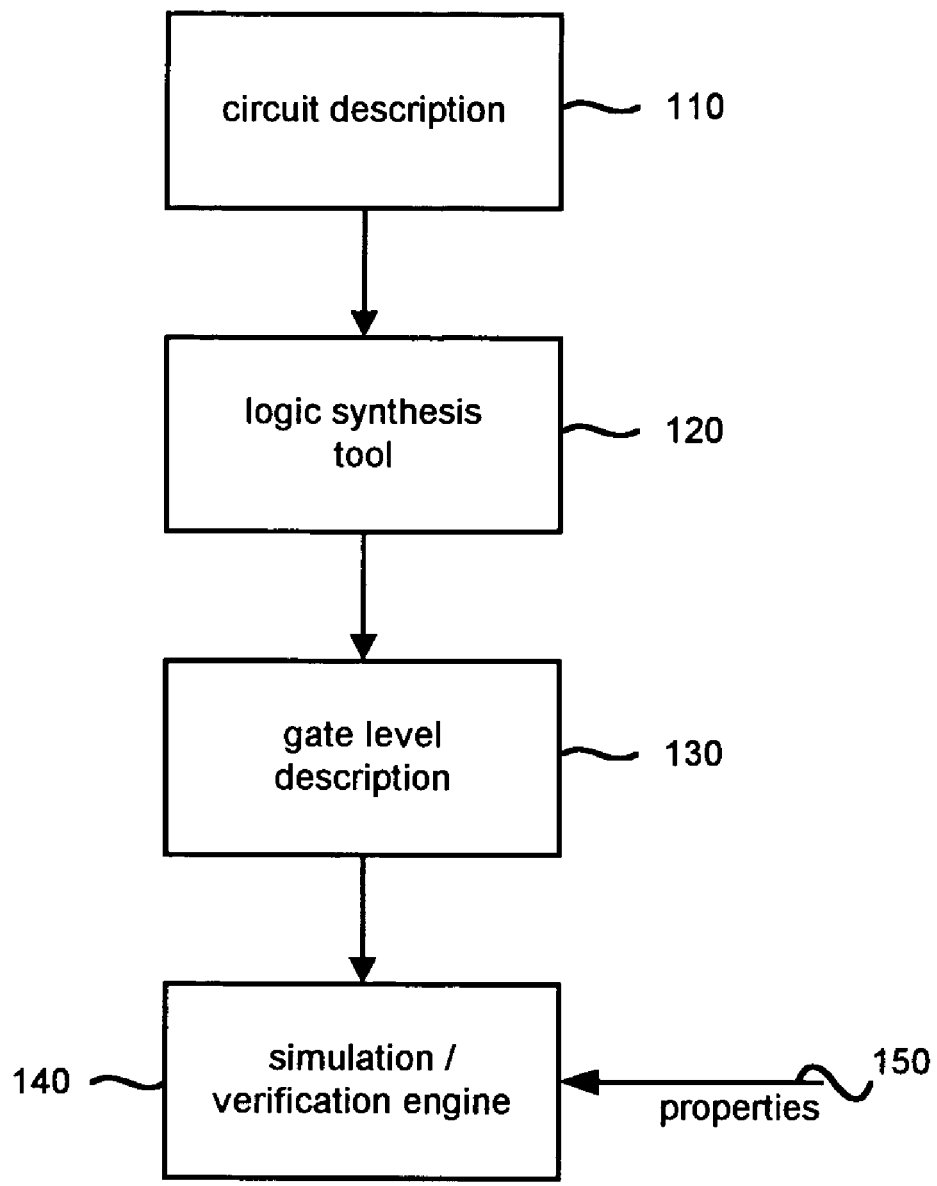
FIG. 1 is a block diagram overview of a prior art EDA tool.

It should be noted that this upper bound can also be affected by additional memory read operations that may be specified in one or more properties 150 of FIG. 1. In such a case, the number of additional memory read operations would have to be added to the total number of memory operations previously calculated. For example, if a given property specified, for example, two additional memory read operations, then the total number of memory read that can occur over the period of time in which the physical memory is modeled is twenty-two (i.e., twenty plus two).

The first steps in modeling a memory write operation, WRITE(WADDR, WDATA), to physical memory 210 includes the steps of receiving write addresses (WADDR) of physical memory 210 to which data (WDATA) has been written, receiving WDATA written to physical memory 210 at the respective write addressees, and asserting a write enable signal. The next step is to check each entry in lookup table 250 to find an entry where the valid bit is asserted and the corresponding address in address field 255 in lookup table 250 of the entry is equivalent to the WADDR. If such an entry exists, WDATA is written to data field 260 of that entry. However, if such an entry in lookup table 250 does not exist, the present invention finds an entry in lookup table 250 with an unasserted valid bit and places WADDR in address field 255 of that entry and WDATA is placed in data field 260 of that entry.

Consider, for example, memory write operation 215 to physical memory 210, WRITE($A_2$, $D_2$), where $A_2$ represents a write address and $D_2$ represents data being written to that write address. Given the write address ($A_2$), the write data ($D_2$), and the assertion of a write enable bit, the first step in modeling this memory write operation to physical memory 210 is to check each entry in lookup table 250 to find an entry where the valid bit is asserted and the address in the address field of that entry matches the write address ($A_2$). In this case, $D_2$ is written to data field 260 of entry number 1 of lookup table 250 since the valid bit of entry number 1 is asserted and $A_2$ is contained in address field 255 of entry number 1. Memory write operations 220 and 225 to physical memory 210 can be similarly modeled. That is, since the valid bit of entry number 2 is asserted and write address $A_4$ is found in address field 255 of entry number 2, the previous contents in data field 260 of entry number 2 are overwritten with write data $D_4$. Also, since the valid bit of entry number 3 of lookup table 250 is asserted and write address $A_5$ is found in address field 255 of entry number 3, write data $D_5$ is written to the data field 260 of entry number 3 (therein overwriting any data that may have previously been in data field 260 of entry number 3).

Consider now memory operation 230 in which write data $D_i$ is written to write address $A_i$ of physical memory 210. If after searching through all the entries in lookup table 250 and there are no entries where the valid bit is asserted and the corresponding address in address field 255 is equal to $A_i$, then the present invention, for example, finds an entry "n", where the valid bit is unasserted and places the write address $A_i$ in address field 255 of entry "n", the write data $D_i$ in data field 260 of entry "n," and asserts the valid bit of entry "n". All memory write operations to physical memory 210 can thus be modeled in lookup table 250.

Figure 3:
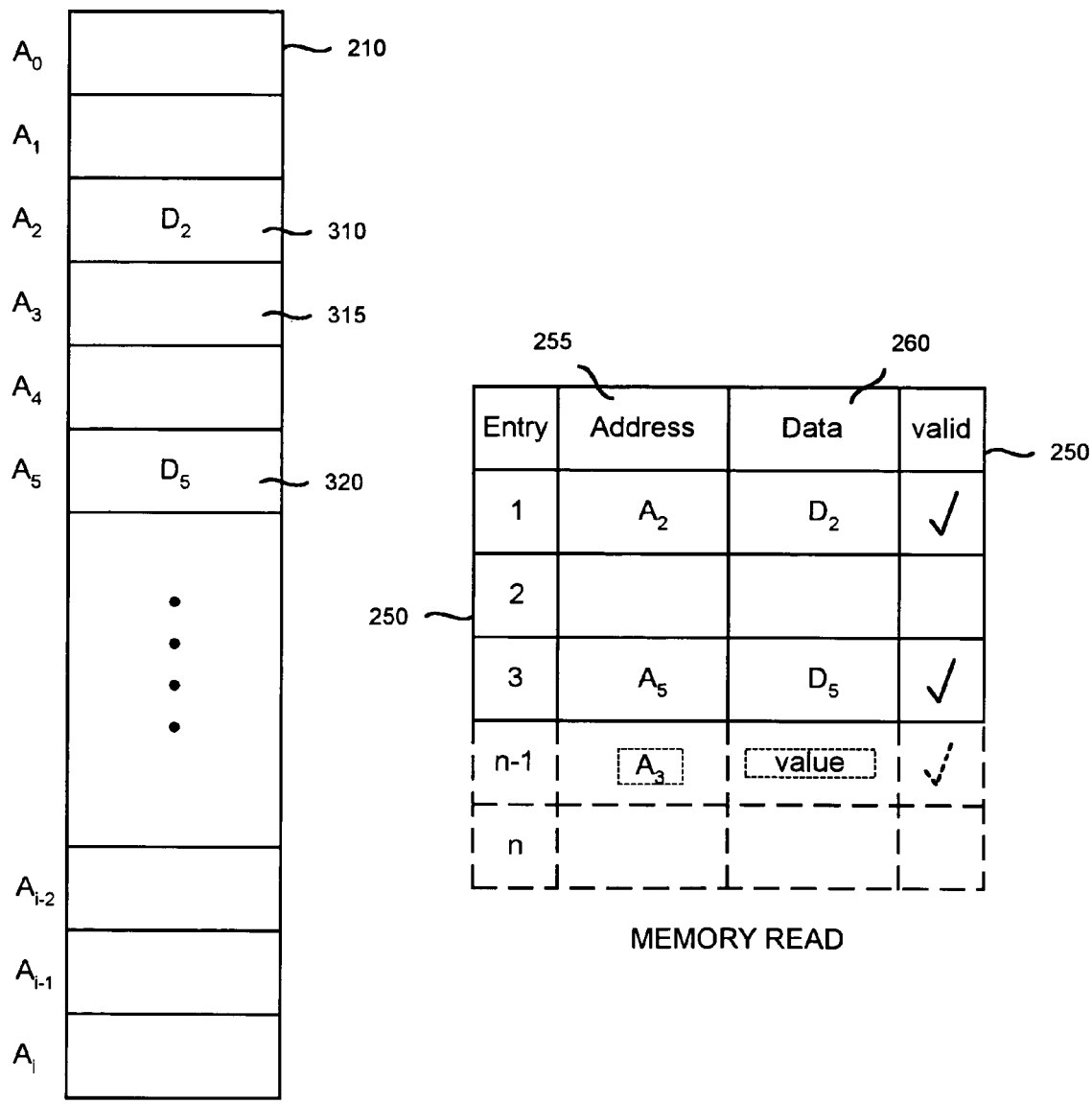
FIG. 3 illustrates a memory model that can be implemented as a lookup table for use in modeling a physical memory of an electronic design.

FIG. 3 illustrates an exemplar memory read operation in accordance with the memory model of the present invention. The steps for modeling a memory read operation to physical memory 210 are similar to those of the memory write operation. Given a particular read address, RADDR, the present invention searches lookup table 250 for entries where the valid bit is asserted and address field 255 for that entry contains the RADDR. If such an entry exists in lookup table 250, the present invention returns the data in data field 260 corresponding to that entry. However, if such an entry is not found in lookup table 250, the present invention first finds an entry in lookup table 250 where the valid bit is unasserted. Next, the read address RADDR is placed in address field 255 of that entry and an arbitrary data value is assigned to data field 260 of that entry. The valid bit of that entry is then asserted and the arbitrary date value assigned to data field 260 is then returned. In one embodiment of the present invention, an initial value to which the contents of lookup table 250 have been previously initialized may be returned instead of the arbitrary data value.

Consider, for example, memory read operation 310, READ($A_2$), where the contents of the memory location in physical memory 210 identified by read address $A_2$ are now being read. The present invention models memory read operation 310 by first searching each entry in lookup table 250 for an entry where the valid bit is asserted and address field 255 of that entry contains read address $A_2$. In this example, the valid bit of entry 1 is asserted and address field 255 of entry 1 contains read address $A_2$. The contents of data field 260 of entry number 1, $D_2$, are thus returned. The present invention similarly models memory read operation 320, READ($A_5$), by first searching lookup table 250 for an entry where the valid bit is asserted and address field 255 of that entry contains read address $A_5$. Entry number 3 of lookup table 250 satisfies these conditions and the contents of data field 260 of entry number 3, $D_5$, are subsequently returned.

Now consider memory read operation 315, READ($A_3$), where data corresponding to read address $A_3$ is being read from physical memory 210. In this scenario, there are no entries in lookup table 250 where the valid bit is asserted and address field 255 contains read address $A_3$. Consequently, the present invention models memory read operation 315 by first finding an entry in lookup table 250, entry "n−1," where the valid bit is unasserted and assigns read address $A_3$ to address field 255 of entry number "n−1," and assigns an arbitrary data value to data field 260 of entry number "n−1." The present invention then asserts the valid bit for entry number "n−1" and subsequently returns the arbitrary data value. As before, in one embodiment of the present invention, an initial value to which the contents of lookup table 250 may have previously initialized may be returned instead of the arbitrary data value. All memory read operations from physical memory 210 can thus also be modeled by lookup table 250.

Figure 4:
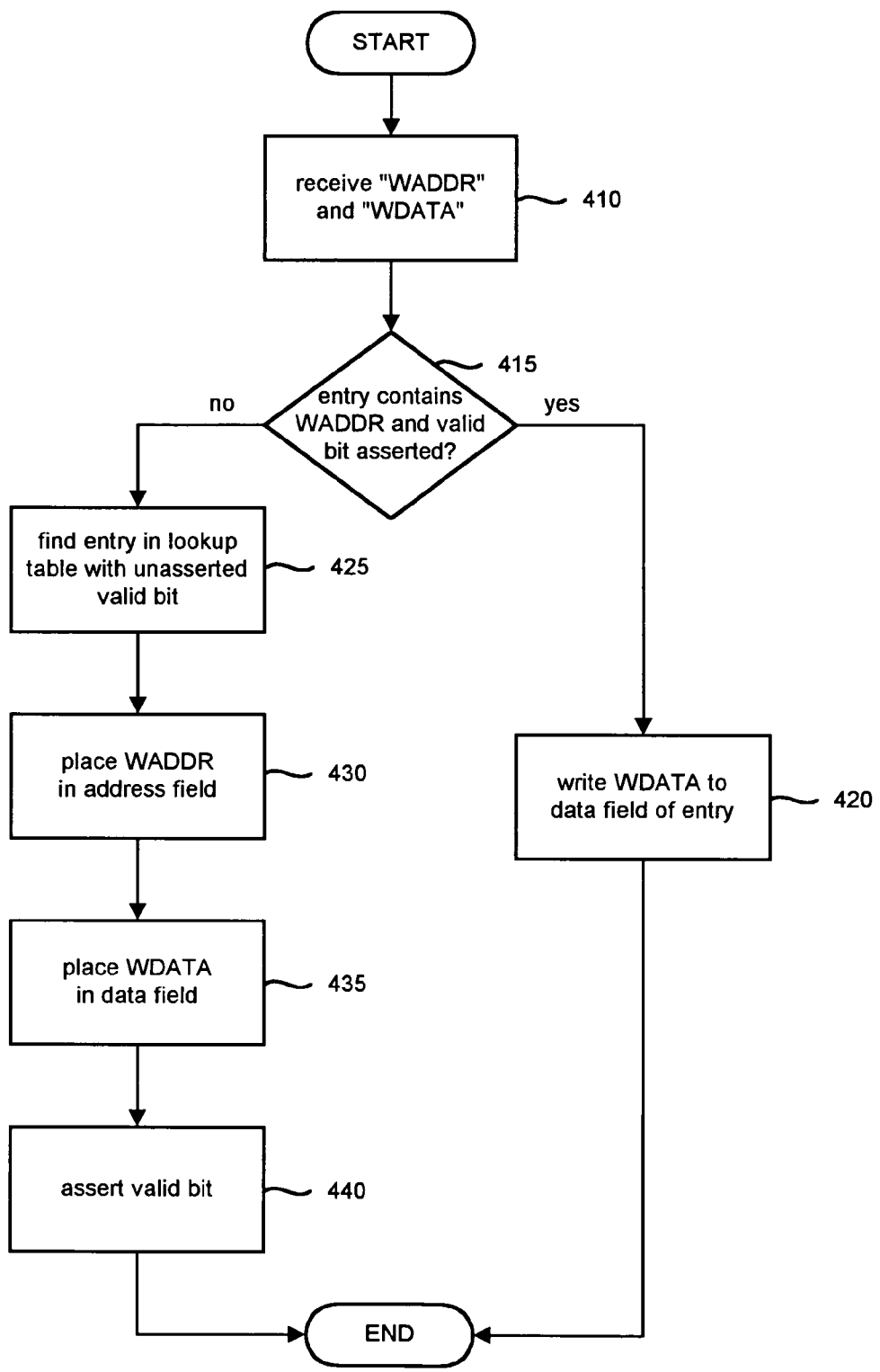
FIG. 4 is a flowchart of an exemplary memory write operation according to the memory model of the present invention.

FIG. 4 is a flowchart of a memory write operation in accordance with the memory model of the present invention. In step 410, the memory write address, WADDR, and the write data, WDATA, corresponding to a memory write operation to physical memory 210 is first received. In step 415, lookup table 250 of FIGS. 2 and 3 is searched for entries where the valid bit is asserted and the corresponding address in the address field of that entry is equal to the write address WADDR. If such an entry in lookup table 250 exists, write data WDATA is written to data field 260 corresponding to that entry in step 420. However, if there are no entries in lookup table 250 where the valid bit is asserted and the corresponding address in address field 255 is equal to write address WADDR, then, in step 425, the present invention finds an entry in lookup table 250 with an unasserted valid bit. In step 430, write address WADDR is placed in address field 255 of that entry. In step 435, write data WDATA is placed in data field 260 of that entry and the valid bit of that entry is asserted in step 440. These steps are performed for each memory write operation to physical memory 210 and the resulting lookup table models all write operations to physical memory 210.

Figure 5:
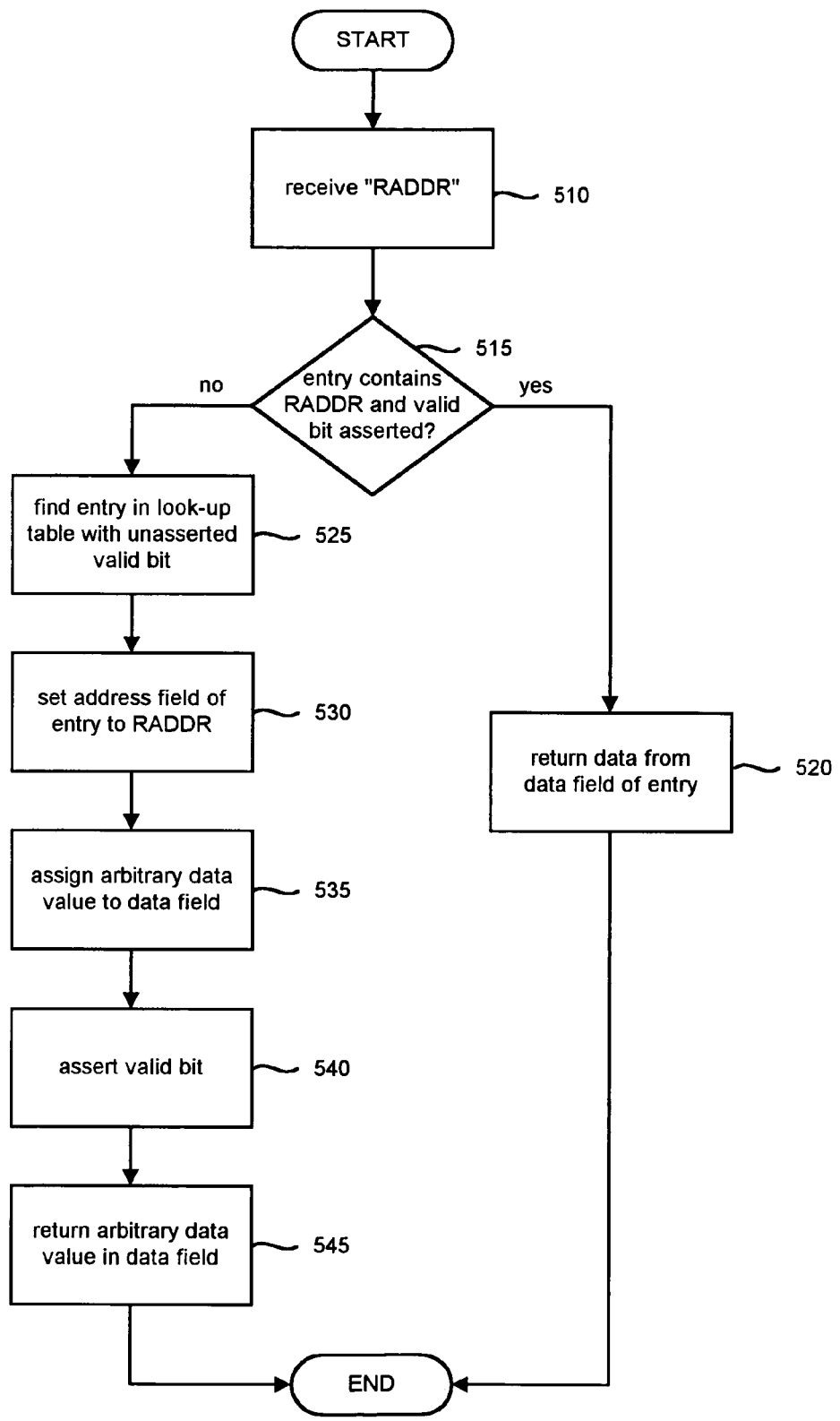
FIG. 5 is a flowchart of an exemplary memory read operation according to the memory model of the present invention.

FIG. 5 is a flowchart of a memory read operation in accordance with the memory model of the present invention. Modeling a memory read operation from physical memory 210 begins in step 510 with read address RADDR being received. In step 515, the present invention searches lookup table 250 for entries where the valid bit is asserted and address field 255 contains the read address RADDR. If such an entry in lookup table 250 exists, the data in data field 260 of that entry is returned in step 520. However, if lookup table 250 does not contain an entry where the valid bit is asserted and address field 255 does not contain read address RADDR, then, in step 525, the present invention finds an entry in lookup table 250 with an unasserted valid bit. In step 530, read address RADDR is placed in address field 255 of that entry and, in step 535, an arbitrary data value is assigned to data field 260 of that entry. In step 540, the valid bit for that entry is asserted and, in step 545, the arbitrary data value in data field 260 of that entry is returned. These steps are performed for each memory read operation from physical memory 210 and the resulting lookup table 250 models all read operations from physical memory 210.

Figure 6:
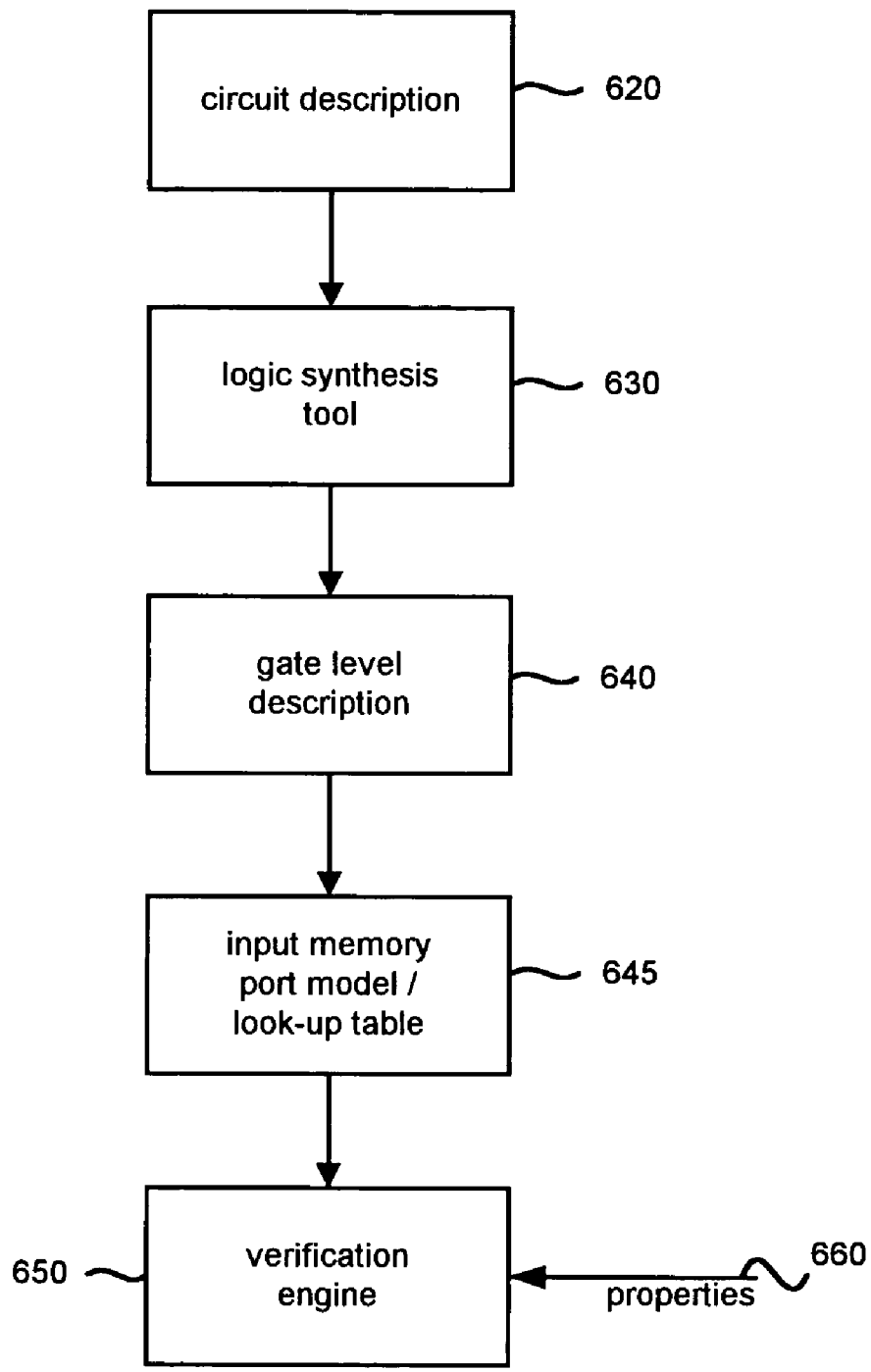
FIG. 6 is a block diagram illustrating the memory model of the present invention as used in an existing EDA tool.

FIG. 6 illustrates how the memory model of the present invention is used in an EDA tool. For a given electronic circuit design having a physical memory, the process of simulating/verifying the design begins with the creation of a circuit description 620 of the design. While this circuit description could be an HDL description, any circuit description of the design will suffice. Circuit description 620 would then be inputted to logic synthesis tool 630. Logic synthesis tool 630 reduces circuit description 620 to a gate level description 640 of the electronic circuit design. That portion of gate level description 640 relating to the physical memory is then replaced with lookup table 645 wherein lookup table 645 effectively models all read and write ports of the physical memory. That is, all memory write operations to the physical memory and all memory read operations from the physical memory are modeled in lookup table 645 in accordance with the steps outlined in FIGS. 4 and 5, respectively. Finally, verification or simulation of the electronic circuit design is performed by a verification or a simulation engine 650 together with a set of properties 660 or behaviors as an input to determine whether, and to what extent, the electronic circuit design satisfies properties 660.

Thus, in accordance with the present invention, all read and write operations to and from any physical memory can be modeled by a lookup table. Aside from being a more efficient way to model only those locations of the physical memory that are accessed by a given design, there are two other significant advantages in using the lookup table approach of the present invention. First, the lookup table approach enables a physical memory to be modeled independent of the underlying simulation or verification engine.

This is significant in that the lookup table approach of the present invention allows circuit designers and chip architects to create memory models that can be used with ALL existing simulation or verification engines.

Figure 6A:
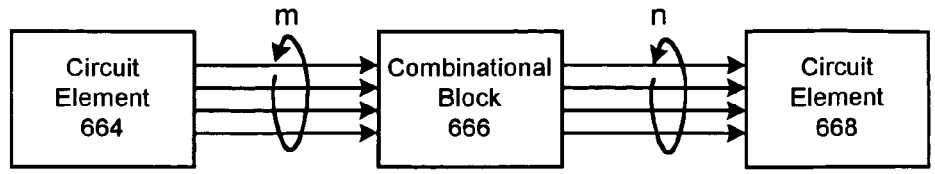
FIG. 6A illustrates another embodiment of the present invention.

Second, and perhaps more importantly, FIG. 6A illustrates another embodiment of the present invention. The lookup table approach of the present invention can be used to model any uninterpreted combinational block 666 or any combinational function, having "m" inputs and "n" outputs, of a given design comprising a circuit element 664 and a circuit element 668. In other words, the lookup table approach of the present invention can be used to model so called "black boxes" or uninterpreted portions of a design. An uninterpreted combinational block 666 or a combinational function can be modeled using a lookup table in much the same way that a memory read operation from physical memory 210 is modeled in lookup table 250 (see FIGS. 3 and 5). The only difference is that the read address is now the argument(s) of the combinational functions.

Figure 6B:
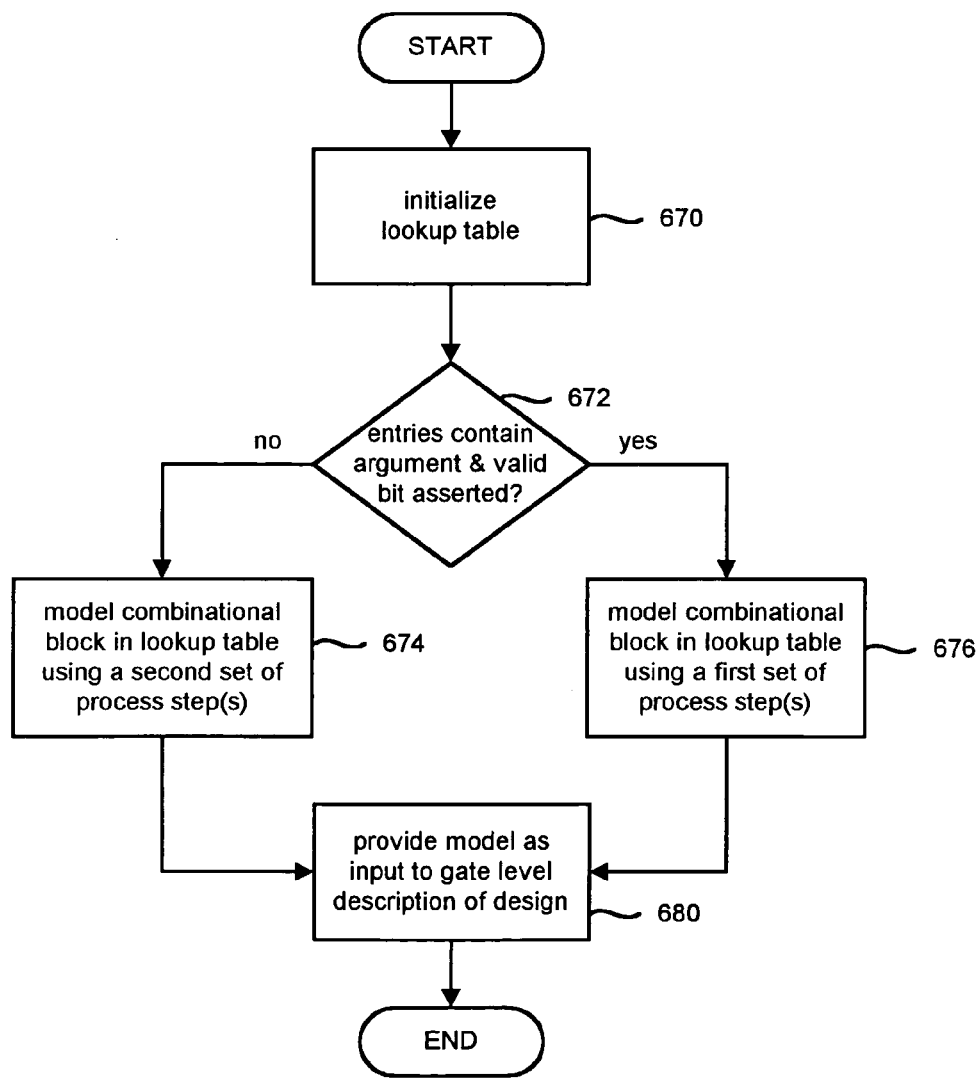
FIG. 6B is a flowchart illustrating another embodiment of the present invention.

FIG. 6B is a flowchart illustrating a method of modeling an uninterpreted combinational block or function using a lookup table. In step 670, the lookup table is initialized. Step 670 may include the steps of initializing the contents of the lookup table to some initial value, and setting all valid bits of the lookup table to some initial state (e.g., unasserted). In step 672, the present invention searches the lookup table for entries where the valid bit is asserted and an "address" field contains the argument(s) of the combinational block or function.

If such an entry in the lookup table exists, then, in step 676, the combinational block or function is modeled using a first set of process step(s). The first set of process step(s) may include a step where a data value corresponding to the argument is returned if an entry in the lookup table comprises the argument and a valid bit of that entry is asserted. However, if such an entry does not exist, then, in step 674, the combinational block or function is modeled using a second set of process step(s). The second set of process step(s) may include the steps where an entry in the lookup table with an unasserted valid bit is found, the argument is placed in the "address" field of that entry, an arbitrary data value is assigned to that entry corresponding to the argument, the valid bit of that entry is asserted, and the arbitrary data value is returned. In step 680, the resulting model of the uninterpreted combinational block can be provided as an input to a gate level description of the design. The design containing the uninterpreted combinational block can then be simulated or verified using an engine (not shown).

For example, a combinational function, f(X), representing a given uninterpreted combinational block of a design where "X" is the argument of the function, can be modeled in a lookup table using a READ(X) operation. As with the memory write operation described in FIGS. 3 and 5, for a given clock cycle, a READ(X) operation will return a data value corresponding to argument "X" if an entry in the lookup table comprises argument "X" in an "address" field and a valid bit of that entry is asserted. If, however, no entries in the lookup table comprise argument "X" and an asserted valid bit, then argument "X" is placed in an entry of the lookup table with an unasserted valid bit, an arbitrary data value corresponding to argument "X" is returned, and the valid bit of that entry is asserted.

This process is repeated for as many clock cycles as are required to verify or simulate the design containing the uninterpreted combinational block. While this exemplar function contains only one argument "X," the lookup table approach of the present invention can be used to model combinational blocks or functions having multiple arguments. The resulting model of any uninterpreted combinational blocks or black boxes of a design will also be engine independent. That is, the resulting model can be used with all existing simulation or verification engines.

Figure 7:
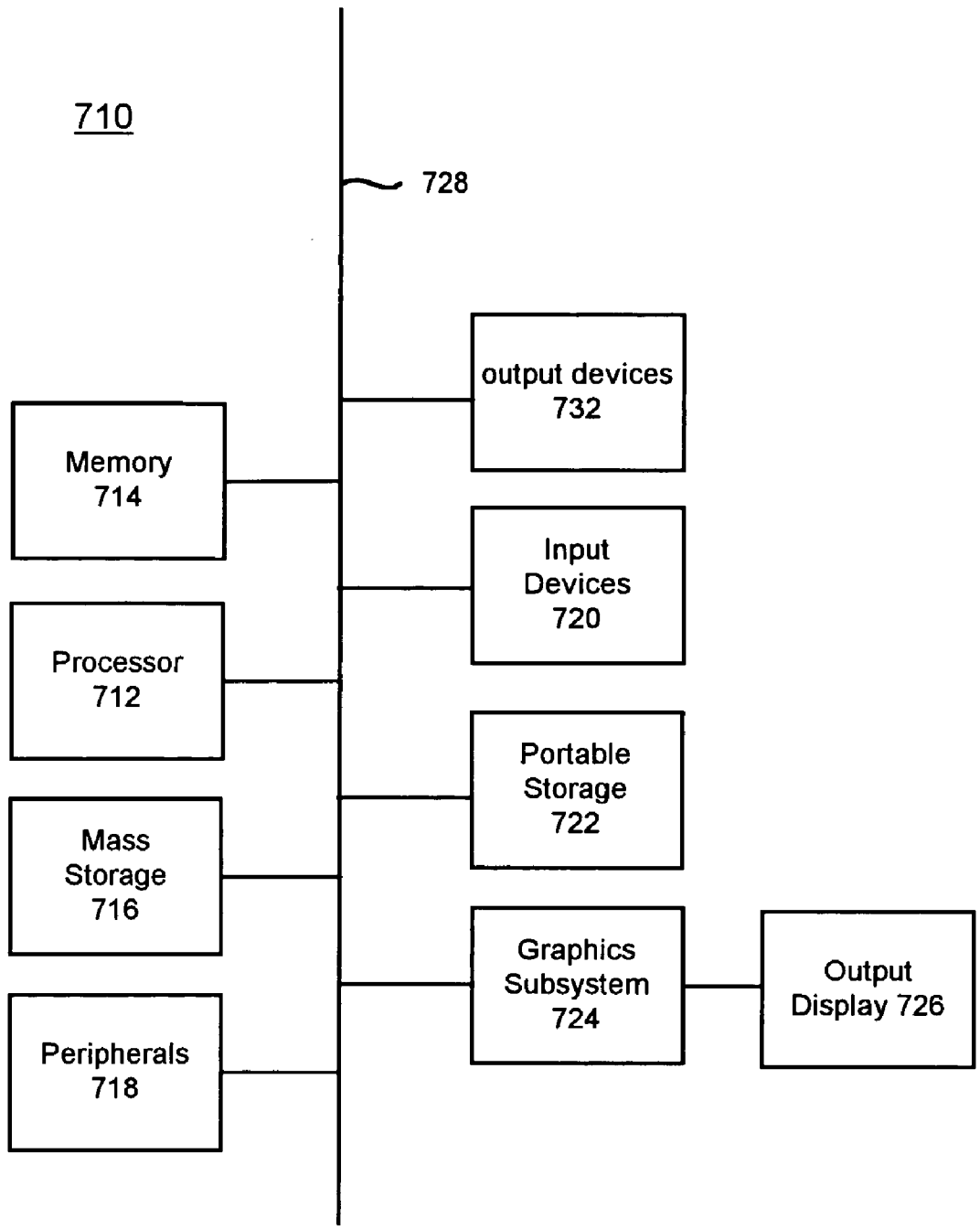
FIG. 7 is a high level block diagram of an exemplar general purpose computer system which can be used to implement the present invention.

FIG. 7 illustrates a high-level block diagram of a general purpose computer system which can be used to implement the present invention. The computer system 710 of FIG. 7 includes a processor unit 712 and main memory 714. Processor unit 712 may contain a single microprocessor, or may contain a plurality of microprocessors for configuring the computer system as a multi-processor system. Main memory 714 stores, in part, instructions and data for execution by processor unit 712. If the present invention is wholly or partially implemented in software, main memory 714 stores the executable code when in operation. Main memory 714 may include banks of dynamic random access memory (DRAM) as well as high-speed cache memories.

The computer system 710 of FIG. 7 further includes a mass storage device 716, peripheral device(s) 718, input device(s) 720, portable storage medium drive(s) 722, a graphics subsystem 724, an output display 726, and output devices 732. For purposes of simplicity, the components in computer system 710 are shown in FIG. 7 as being connected via a single bus 728. However, computer system 710 may be connected through one or more data transport means. For example, processor unit 712 and main memory 714 may be connected via a local microprocessor bus, and the mass storage device 716, peripheral device(s) 718, portable storage medium drive(s) 722, graphics subsystem 724, and output devices 732 may be connected via one or more input/output (I/O) buses. Mass storage device 716, which may be implemented with a magnetic disk drive or an optical disk drive, is a non-volatile storage device for storing data and instructions for use by processor unit 712. In one embodiment, mass storage device 16 stores the system software for determining a path for purposes of loading to main memory 714.

Portable storage medium drive 722 operates in conjunction with a portable non-volatile storage medium, such as a floppy disk, to input and output data and code to and from computer system 710. In one embodiment, the system software for determining a path is stored on such a portable medium, and is input to the computer system 710 via the portable storage medium drive 722. Peripheral device(s) 718 may include any type of computer support device, such as an input/output (I/O) interface, to add additional functionality to the computer system 710. For example, peripheral device (s) 718 may include a network interface card for interfacing computer system 710 to a network, a modem, etc.

Input device(s) 720 provide a portion of the user interface for a user of computer system 710. Input device(s) 720 may include an alpha-numeric keypad for inputting alpha-numeric and other key information, or a cursor control device, such as a mouse, a trackball, stylus, or cursor direction keys. In order to display textual and graphical information, computer system 710 contains graphics subsystem 724 and the output display 726. Output display 726 may include a cathode ray tube (CRT) display, liquid crystal display (LCD) or other suitable display device. Graphics subsystem 724 receives textual and graphical information, and processes the information for output to output display 726.

Output display 726 can be used to report the results of a sign text computation. Output devices 732 provide another means for reporting the results of a sign text computation. Output devices 732 may include a printer, a personal digital assistant (PDA), a modem, a cellular telephone capable of transmitting and receiving text messages, audio speakers, or any other device to which the results of the sign text The components contained in computer system 710 are those typically found in general purpose computer systems, and are intended to represent a broad category of such computer components that are well known in the art.

The components contained in the computer system of FIG. 7 are those typically found in general purpose computer systems, and are intended to represent a broad category of such computer components that are well known in the art. Thus, the computer system of FIG. 7 can be a personal computer, workstation, minicomputer, mainframe computer, etc. The computer can also include different bus configurations, networked platforms, multi-processor platforms, etc. Various operating systems can be used including Unix, Linux, Windows, Macintosh OS, and other suitable operating systems.

The foregoing description of preferred embodiments of the present invention has been provided for the purposes of illustration and description. It is not intended to be exhaustive or to limit the invention to the precise forms disclosed. Many modifications and variations will be apparent to practitioners skilled in this art. The described embodiments were chosen and described in order to best explain the principles of the invention and its practical application to thereby enable others skilled in the art to understand the invention for various embodiments and with various modifications as are suited to the particular use contemplated. It is intended that the scope of the invention be defined by the following claims and their equivalents.

What is claimed is:

1. A method for modeling a physical memory for use in an electronic circuit design, the method comprising:
   accessing a description of the electronic circuit design;
   replacing a portion of the description of the electronic circuit design with a lookup table, wherein the portion of the description relates to the physical memory, and wherein the lookup table in the description represents the physical memory, the lookup table including a total number of entries greater than or equal to a total number of memory operations that can occur over a given number of clock cycles, the total number of memory operations being computed by computing a total number of memory operations that can be performed per clock cycle and multiplying the total number of memory operations that can be performed per clock cycle by the given number of clock cycles; and
   simulating the electronic circuit design using the description, wherein simulating includes modeling a memory write operation of the electronic circuit design using the lookup table and modeling a memory read operation of the electronic circuit design using the lookup table.

2. The method of claim 1, wherein modeling a memory write operation comprises the steps of:
   receiving a plurality of write address bits corresponding to a write address of the physical memory to which a plurality of write data bits are written by the electronic circuit design;
   receiving the plurality of write data bits corresponding to write data written to the physical memory at the write address; and
   determining whether the lookup table comprises a first entry that contains the plurality of write address bits in an address field and a valid bit of the first entry is asserted.

3. The method of claim 2, wherein modeling a memory write operation further comprises the step of:
   writing the plurality of write data bits to a data field of the first entry if the first entry contains the plurality of write address bits in the address field and a valid bit of the first entry is asserted.

4. The method of claim 2, wherein modeling a memory write operation further comprises the following steps if the first entry does not contain the plurality of write address bits in the address field and a valid bit of the first entry is not asserted:
   finding a second entry in the lookup table wherein a valid bit of the second entry is not asserted;
   writing the plurality of write address bits to an address field of the second entry;
   writing the plurality of write data bits to a data field of the second entry; and
   asserting the valid bit of the second entry.

5. The method of claim 1, wherein modeling a memory read operation comprises the steps of:
   receiving a plurality of read address bits corresponding to a read address of the physical memory from which a plurality of read data bits are read by the electronic design; and
   determining whether the lookup table comprises a first entry that contains the plurality of read address bits in an address field and a valid bit of the first entry is asserted.

6. The method of claim 5, wherein modeling a memory read operation further comprises the step of:
   returning the plurality of read data bits from a data field of the first entry if the first entry contains the plurality of read address bits in the address field and a valid bit of the first entry is asserted.

7. The method of claim 5, wherein modeling a memory read operation further comprises the following steps if the first entry does not contain the plurality of read address bits in the address field and a valid bit of the first entry is not asserted:
   finding a second entry in the lookup table wherein a valid bit of the second entry is not asserted;
   writing the plurality of read address bits to an address field of the second entry;
   assigning a plurality of read data bits corresponding to an arbitrary data value to a data field of the second entry;
   asserting the valid bit of the second entry; and
   returning the arbitrary data value.

8. The method of claim 7, wherein the arbitrary data value represents an initial value of the plurality of read data bits after an initialization step.

9. The method of claim 1, further comprising:
   determining a number of memory read operations in a property; and
   adding the number of memory read operations in a property to the total number of memory operations that can occur over the given number of clock cycles.

10. The method of claim 1, further comprising the step of:
    initializing a plurality of bits in a data field of an entry of the lookup table to an initial value.

11. A method for modeling an uninterpreted combinational block of an electronic circuit design in a lookup table, the uninterpreted combinational block being represented by a combinational function having an argument, the method comprising:
    accessing a description of the electronic circuit design;
    replacing a portion of the description of the electronic circuit design with the lookup table, wherein the portion of the description relates to the uninterpreted combinational block, and wherein the lookup table in the description represents the uninterpreted combinational block, the lookup table including a total number of entries greater than or equal to a total number of times the uninterpreted combinational block will be evaluated over a given number of clock cycles, the total number of times the uninterpreted combinational block will be evaluated being computed by computing a total number of times the uninterpreted combinational block will be evaluated per clock cycle and multiplying the total number of times the uninterpreted combinational block will be evaluated per clock cycle by the given number of clock cycles; and simulating the electronic circuit design using the description, wherein simulating includes:
  initializing the lookup table,
  receiving the argument,
  determining whether the lookup table comprises a first entry that contains the argument in an address field of the first entry and a valid bit of the first entry is asserted, and
  returning a data value in a data field of the first entry if the first entry contains the argument and the valid bit of the first entry is asserted, the data value being associated with the argument.

12. The method of claim 11, further comprising writing the argument to an address field of a second entry having an unasserted valid bit, assigning an arbitrary data value to a data field of the second entry wherein the arbitrary data value is prospectively associated with the argument, asserting the valid bit of the second entry, and returning the arbitrary data value if the lookup table does not comprise a first entry that contains the argument in the address field of the first entry and the valid bit of the first entry is not asserted.

13. A method for modeling a physical memory in an electronic circuit design, the method comprising:
  accessing a description of the electronic circuit design;
  replacing a portion of the description of the electronic circuit design with a memory model, wherein the portion of the electronic circuit design relates to the physical memory, and wherein the memory model in the description represents the physical memory, the memory model including a total number of entries that is greater than or substantially equal to a total number of memory operations that can occur over a given number of clock cycles, the total number of memory operations being computed by:
    determining a number of read ports of the physical memory,
    determining a number of write ports of the physical memory,
    computing a total number of memory operations that can be performed per clock cycle based on the number of read ports and write ports, and
    multiplying the total number of memory operations that can be performed per clock cycle with the given number of clock cycles; and
  simulating the electronic circuit design using the description, wherein simulating includes:
    receiving a plurality of write address bits corresponding to a write address of the physical memory to which the electronic circuit design writes a plurality of write data bits,
    receiving the plurality of write data bits written by the electronic circuit design to the physical memory at the write address,
    modeling a memory write operation of the electronic circuit design in the memory model to represent a memory write operation in the physical memory, and
    determining whether the memory model comprises an entry that contains the plurality of write address bits in an address field and whether a valid bit of the entry is asserted.

14. The method of claim 13, wherein the plurality of write data bits are written to a data field of the entry if the entry contains the plurality of write address bits in the address field and the valid bit of the entry is asserted.

15. The method of claim 13, further comprising the following steps if the entry does not contain the plurality of write address bits in the address field and a valid bit of the entry is not asserted:
  finding a second entry in the memory model wherein a valid bit of the second entry is not asserted;
  writing the plurality of write address bits to an address field of the second entry;
  writing the plurality of write data bits to a data field of the second entry; and
  asserting the valid bit of the second entry.

16. The method of claim 13, further comprising:
  receiving a plurality of read address bits corresponding to a read address of the physical memory from which the electronic circuit design reads a plurality of read data bits;
  modeling a memory read operation in the memory model to represent a memory read operation in the physical memory; and
  determining whether the entry contains the plurality of read address bits in the address field and whether the valid bit of the entry is asserted.

17. The method of claim 16, wherein the plurality of read data bits from a data field of the entry is returned if the entry contains the plurality of read address bits in the address field and the valid bit of the entry is asserted.

18. The method of claim 16, further comprising the following steps if the entry does not contain the plurality of read address bits in the address field and a valid bit of the entry is not asserted:
  finding a second entry in the memory model wherein a valid bit of the second entry is not asserted;
  writing the plurality of read address bits to an address field of the second entry;
  assigning a plurality of read data bits corresponding to an arbitrary value to a data field of the second entry;
  asserting the valid bit of the second entry; and
  returning the arbitrary value.

19. The method of claim 13, wherein the memory model comprises a lookup table.

20. The method of claim 13, further comprising:
  determining a number of memory read operations in a property; and
  adding the number of memory read operations in a property to the total number of memory operations that can occur over the given number of clock cycles.

21. A method for modeling an electronic circuit design having a physical memory, the physical memory being represented by a lookup table, the method comprising:
  creating a hardware description language description of a plurality of components of the electronic circuit design including the physical memory;
  synthesizing a gate level description of the plurality of components of the electronic circuit design including the physical memory;

replacing a portion of the gate level description relating to the physical memory with the lookup table, the lookup table having a total number of entries that is greater than or substantially equal to a total number of memory operations that can occur over a given number of clock cycles, the total number of memory operations being computed by:
  determining a total number of memory read ports in the physical memory,
  determining a total number of memory write ports in the physical memory,
  computing a total number of memory operations that can be performed per clock cycle based on the number of read ports and write ports, and
  multiplying the total number of memory operations that can be performed per clock cycle with the given number of clock cycles; and
verifying operation of the electronic circuit design using a set of properties.

22. The method of claim 21, further comprising modeling at least one memory operation of the electronic circuit design by:
  receiving a plurality of write address bits corresponding to a write address of the physical memory to which the electronic circuit design writes a plurality of write data bits;
  receiving the plurality of write data bits written by the electronic circuit design to the physical memory at the write address;
  receiving a plurality of read address bits corresponding to a read address of the physical memory from which the electronic circuit design reads a plurality of read data bits;
  determining whether the lookup table comprises an entry that contains the plurality of read address bits in the address field and whether the valid bit of the entry is asserted;
  returning the plurality of read data bits from a data field of the entry if the entry contains the plurality of read address bits in the address field and a valid bit of the entry is asserted;
  determining whether the lookup table comprises an entry that contains the plurality of write address bits in an address field and whether a valid bit of the entry is asserted; and
  writing the plurality of write data bits to the data field of the entry if the entry contains the plurality of write address bits in the address field and the valid bit of the entry is asserted.

23. The method of claim 22, further comprising the following steps if the entry does not contain the plurality of read address bits in the address field and a valid bit of the entry is not asserted:
  finding a second entry in the lookup table wherein a valid bit of the second entry is not asserted;
  writing the plurality of read address bits to an address field of the second entry;
  assigning a plurality of read data bits corresponding to an arbitrary value to a data field of the second entry;
  asserting the valid bit of the second entry; and
  returning the arbitrary value.

24. The method of claim 22, further comprising the following steps if the entry does not contain the plurality of write address bits in the address field and a valid bit of the entry is not asserted:
  finding a second entry in the memory model wherein a valid bit of the second entry is not asserted;
  writing the plurality of write address bits to an address field of the second entry;
  writing the plurality of write data bits to a data field of the second entry; and
  asserting the valid bit of the second entry.

25. The method of claim 21, further comprising the steps of:
  determining a number of memory read operations performed in the set of properties; and
  adding the number of memory read operations performed in the set of properties to the total number of memory operations that can occur over the given number of clock cycles.

26. A processor readable storage medium having processor readable code embodied on the processor readable storage medium, the processor readable code for programming a processor to perform a method for creating a memory model for use in modeling an electronic circuit design having a physical memory, the method comprising:
  accessing a description of the electronic circuit design;
  replacing a portion of the description of the electronic circuit design with a lookup table, wherein the portion of the description relates to the physical memory, and wherein the lookup table in the description represents the physical memory, the lookup table including a total number of entries greater than or equal to a total number of memory operations that can occur over a given number of clock cycles, the total number of memory operations being computed by computing a total number of memory operations that can be performed per clock cycle and multiplying the total number of memory operations that can be performed per clock cycle by the given number of clock cycles; and
  simulating the electronic circuit design using the description, wherein simulating includes modeling a memory write operation of the electronic circuit design using the lookup table and modeling a memory read operation of the electronic circuit design using the lookup table.

27. The processor readable storage medium of claim 26, wherein modeling a memory write operation comprises the steps of:
  receiving a plurality of write address bits corresponding to a write address of the physical memory to which a plurality of write data bits are written by the electronic design;
  receiving the plurality of write data bits written to the physical memory at the write address;
  determining whether the lookup table comprises a first entry that contains the plurality of write address bits in an address field and a valid bit of the first entry is asserted; and
  writing the plurality of write data bits to a data field of the first entry if the first entry contains the plurality of write address bits in the address field and the valid bit of the first entry is asserted.

28. The processor readable storage medium of claim 27, wherein modeling a memory write operation further comprises the following steps if the first entry does not contain the plurality of write address bits in the address field and a valid bit of the first entry is not asserted:
  finding a second entry in the lookup table wherein a valid bit of the second entry is not asserted;
  writing the plurality of write address bits to an address field of the second entry;
  writing the plurality of write data bits to a data field of the second entry; and
  asserting the valid bit of the second entry.

29. The processor readable storage medium of claim 26, wherein modeling a memory read operation comprises the steps of:
  receiving a plurality of read address bits corresponding to a read address of the physical memory from which a plurality of read data bits are read by the electronic design;
  determining whether the lookup table comprises a first entry that contains the plurality of read address bits in an address field and a valid bit of the first entry is asserted; and
  returning the plurality of read data bits from a data field of the first entry if the first entry contains the plurality of read address bits in the address field and the valid bit of the first entry is asserted.

30. The processor readable storage medium of claim 27, wherein modeling a memory read operation further comprises the following steps if the first entry does not contain the plurality of read address bits in the address field and the valid bit of the first entry is not asserted:
  finding a second entry in the lookup table wherein a valid bit of the second entry is not asserted;
  writing the plurality of read address bits to an address field of the second entry;
  assigning a plurality of read data bits corresponding to an arbitrary value to a data field of the second entry;
  asserting the valid bit of the second entry; and
  returning the arbitrary value.

31. An apparatus for creating a memory model for use in modeling an electronic circuit design having a physical memory, the apparatus comprising:
  an output device;
  a processor, in communication with the output device; and
  a processor readable storage medium for storing code, the processor readable storage medium being in communication with the processor, the code capable of programming the processor to perform the steps of:
    accessing a description of the electronic circuit design;
    replacing a portion of the description of the electronic circuit design with the memory model, wherein the portion of the description relates to the physical memory, and wherein the memory model in the description represents the physical memory, the memory model including a total number of entries that is greater than or substantially equal to a total number of memory operations that can occur over a given number of clock cycles, the total number of memory operations being computed by:
      determining a number of read ports of the physical memory,
      determining a number of write ports of the physical memory,
      computing a total number of memory operations that can be performed by the electronic circuit design per clock cycle based on the number of read ports and write ports, and
      multiplying the total number of memory operations that can be performed per clock cycle by the given number of clock cycles; and
    simulating the electronic circuit design using the description, wherein simulating includes:
      receiving a plurality of write address bits corresponding to a write address of the physical memory to which the electronic circuit design writes a plurality of write data bits,
      receiving the plurality of write data bits written by the electronic circuit design to the physical memory at the write address,
      receiving a plurality of read address bits corresponding to a read address of the physical memory from which the electronic circuit design reads a plurality of read data bits,
      modeling a memory write operation of the electronic circuit design using the memory model,
      modeling a memory read operation of the electronic circuit design using the memory model,
      determining whether the memory model comprises an entry that contains the plurality of write address bits in an address field and whether a valid bit of the entry is asserted, and
      determining whether the entry contains the plurality of read address bits in the address field and whether the valid bit of the entry is asserted.

32. The apparatus of claim 31, wherein the code capable of programming the processor performs the following steps if the entry does not contain the plurality of read address bits in the address field and a valid bit of the entry is not asserted:
  finding a second entry in the memory model wherein a valid bit of the second entry is not asserted;
  writing the plurality of read address bits to an address field of the second entry;
assigning a plurality of read data bits corresponding to an arbitrary value to a data field of the second entry;
  asserting the valid bit of the second entry; and
  returning the arbitrary value.

33. The apparatus of claim 31, wherein the code capable of programming the processor further comprises the step of:
  returning the plurality of read data bits from a data field of the entry if the entry contains the plurality of read address bits in the address field and the valid bit of the entry is asserted.

34. The apparatus of claim 31, wherein the code capable of programming the processor performs the following steps if the entry does not contain the plurality of write address bits in the address field and a valid bit of the entry is not asserted:
  finding a second entry in the memory model wherein a valid bit of the second entry is not asserted;
  writing the plurality of write address bits to an address field of the second entry;
  writing the plurality of write data bits to a data field of the second entry; and
  asserting the valid bit of the second entry.

35. The apparatus of claim 31, wherein the code capable of programming the processor further comprises the step of:
  writing the plurality of write data bits to a data field of the entry if the entry contains the plurality of write address bits in the address field and the valid bit of the entry is asserted.

36. The apparatus of claim 31, wherein the memory model comprises a lookup table.

37. The apparatus of claim 31, wherein the code capable of programming the processor further comprises the steps of:
  determining a number of memory read operations in a property, the property being a set of behaviors of the physical memory; and
  adding the number of memory read operations in a property to the total number of memory operations that can occur over the given number of clock cycles.

38. An apparatus for creating a model of an uninterpreted combinational block of an electronic circuit design using a lookup table, the uninterpreted combinational block being represented by a combinational function having an argument, the apparatus comprising:
- an output device;
- a processor, in communication with the output device; and
- a processor readable storage medium for storing code, the processor readable storage medium being in communication with the processor, the code capable of programming the processor to perform the steps of:
  - accessing a description of the electronic circuit design,
  - replacing a portion of the description of the electronic circuit design with the lookup table, wherein the portion of the description relates to the uninterpreted combinational block, and wherein the lookup table in the description represents the uninterpreted combinational block, the lookup table including a total number of entries greater than or equal to a total number of times the uninterpreted combinational block will be evaluated over a given number of clock cycles, the total number of times the uninterpreted combinational block will be evaluated being computed by computing a total number of times the uninterpreted combinational block will be evaluated per clock cycle and multiplying the total number of times the uninterpreted combinational block will be modeled per clock cycle by the given number of clock cycles, and
  - simulating the electronic circuit design using the description, wherein simulating includes:
    - receiving the argument,
    - determining whether the lookup table comprises a first entry that contains the argument in an address field of the first entry and a valid bit of the first entry is asserted, and
    - returning a data value in a data field of the first entry if the first entry contains the argument and the valid bit of the first entry is asserted, the data value being associated with the argument.

39. The apparatus of claim 38, wherein the code capable of programming the processor further comprises the step of: initializing the lookup table.

40. The apparatus of claim 38, wherein the code capable of programming the processor further comprises the steps of writing the argument to an address field of a second entry having an unasserted valid bit, assigning an arbitrary data value to a data field of the second entry wherein the arbitrary data value is prospectively associated with the argument, asserting the valid bit of the second entry, and returning the arbitrary data value if the lookup table does not comprise a first entry that contains the argument in the address field of the first entry and the valid bit of the first entry is not asserted.

41. The method of claim 1, wherein the lookup table is a software data structure that is used to represent the physical memory and the description of the electronic circuit design is a hardware description language description of the electronic circuit design.

42. The method of claim 1, wherein the description of the electronic circuit design is a gate level description of the electronic circuit design.

43. The method of claim 11, wherein the lookup table is a software data structure that is used to represent the uninterpreted combinational block and the description of the electronic circuit design is a hardware description language description of the electronic circuit design.

44. The method of claim 11, wherein the memory model is a software data structure that is used to represent the physical memory and the description of the electronic circuit design is a gate level description of the electronic circuit design.

45. The method of claim 26, wherein the lookup table is a software data structure that is used to represent the physical memory and the description of the electronic design is a hardware description language description of the electronic circuit design.

46. The method of claim 1, wherein simulating the electronic circuit design includes:
- verifying operation of the electronic circuit design using a set of properties.

47. The method of claim 11, wherein simulating the electronic circuit design includes:
- verifying operation of the electronic circuit design using a set of properties.

48. The method of claim 13, wherein simulating the electronic circuit design includes:
- verifying operation of the electronic circuit design using a set of properties.

49. The processor readable storage medium of claim 26, wherein simulating the electronic circuit design includes:
- verifying operation of the electronic circuit design using a set of properties.

50. The apparatus of claim 31, wherein the step of simulating the electronic circuit design includes:
- verifying operation of the electronic circuit design using a set of properties.

51. The apparatus of claim 38, wherein the step of simulating the electronic circuit design includes:
- verifying operation of the electronic circuit design using a set of properties.

* * * * *

UNITED STATES PATENT AND TRADEMARK OFFICE
CERTIFICATE OF CORRECTION

PATENT NO.         : 6,968,305 B1
APPLICATION NO. : 09/586191
DATED                 : November 22, 2005
INVENTOR(S)       : Isles It is certified that error appears in the above-identified patent and that said Letters Patent is hereby corrected as shown below:

Col. 15, line 16: After "claim" and before "wherein" delete "27" and substitute --29--

Signed and Sealed this

Seventh Day of November, 2006

JON W. DUDAS
*Director of the United States Patent and Trademark Office*